(12) United States Patent
Hashimoto (10) Patent No.: US 8,901,653 B2
(45) Date of Patent: Dec. 2, 2014

(54) SEMICONDUCTOR DEVICE

(75) Inventor: Fuminori Hashimoto, Fukaya (JP)

(73) Assignee: Semiconductor Components Industries, LLC, Phoenix, AZ (US)

(*) Notice: Subject to any disclaimer, the term of this patent is extended or adjusted under 35 U.S.C. 154(b) by 259 days.

(21) Appl. No.: 13/478,810

(22) Filed: May 23, 2012

(65) Prior Publication Data

US 2012/0299095 A1 Nov. 29, 2012

(30) Foreign Application Priority Data

May 23, 2011 (JP) ................................. 2011-114579

(51) Int. Cl.
*H01L 29/78* (2006.01)
*H01L 29/417* (2006.01)
*H01L 29/423* (2006.01)
*H01L 23/00* (2006.01)

(52) U.S. Cl.
CPC .... *H01L 29/41758* (2013.01); *H01L 29/42372* (2013.01); *H01L 29/4238* (2013.01); *H01L 29/7835* (2013.01); *H01L 24/16* (2013.01); *H01L 2224/16227* (2013.01); *H01L 2224/16225* (2013.01)
USPC .......................................... 257/342; 257/355

(58) Field of Classification Search
CPC ................... H01L 29/41758; H01L 29/42372; H01L 29/4238; H01L 29/7835; H01L 2224/16225; H01L 24/16; H01L 2224/16227; H01L 29/78
USPC ........................................... 257/342, E29.256
See application file for complete search history.

(56) References Cited

U.S. PATENT DOCUMENTS

| 5,874,763 | A | * | 2/1999 | Ham | 257/360 |
| 6,255,679 | B1 | * | 7/2001 | Akiba | 257/284 |
| 6,268,632 | B1 | * | 7/2001 | Sugimura et al. | 257/365 |
| 2007/0187780 | A1 | * | 8/2007 | Tiemeijer | 257/401 |
| 2007/0228424 | A1 | * | 10/2007 | Igarashi | 257/256 |
| 2009/0050968 | A1 | * | 2/2009 | Takasu et al. | 257/355 |

FOREIGN PATENT DOCUMENTS

JP  2010-171433  8/2010

\* cited by examiner

*Primary Examiner* — Asok K Sarkar
*Assistant Examiner* — Dmitriy Yemelyanov
(74) *Attorney, Agent, or Firm* — Kevin B. Jackson (57) ABSTRACT

In one embodiment, a semiconductor chip includes a gate electrode extending between a source electrode and a drain electrode. The source electrode and the drain electrode include finger form electrodes that are an engaged arrangement with each other. One or more gate drawing electrodes are connected to portions of the gate electrode, and protrusion electrodes connect the gate drawing electrodes to a gate shunting wiring disposed on a substrate.

20 Claims, 8 Drawing Sheets

SEMICONDUCTOR DEVICE

CROSS-REFERENCE OF THE INVENTION

This application claims priority from Japanese Patent Application No. 2011-114579, filed May 23, 2011, the content of which is incorporated herein by reference in its entirety.

BACKGROUND OF THE INVENTION

1. Field of the Invention

The invention relates to a semiconductor device, in particular, a semiconductor device including a power MOS transistor with low on-resistance and high switching performance.

2. Description of the Related Art

A power MOS transistor has higher switching performance and more stable performance than a bipolar type power transistor, and thus it is widely used in an inverter circuit for a switching power supply such as a DC-DC converter, an inverter circuit for a motor, and so on.

In recent years, a power MOS transistor used in such circuits needs to have still lower on-resistance and higher switching performance so as to correspond to portable devices becoming smaller and lighter such as a mobile phone. The on-resistance of a power MOS transistor is decreased by increasing the impurity concentration of the drift layer which is a low concentration drain layer.

However, the increasing of the impurity concentration of the drift layer decreases the drain-source breakdown voltage $BV_{DS}$. In other words, the on-resistance and $BV_{DS}$ are in a tradeoff relation. Therefore, the impurity concentration of the drift layer can not be increased without limit. In order to decrease the on-resistance under a predetermined $BV_{DS}$, the cross section of the flow path of a drain current need be increased. In other words, the gate width W need be increased.

In this case, finger form electrodes are employed for a drain electrode and a source electrode in order to avoid increasing the die size, in which the drain electrode and the source electrode respectively form a plurality of fingers and these fingers are inserted therebetween. A gate electrode is disposed between the finger form drain electrode and source electrode, and extends from one end to another end of the finger form electrodes.

The switching performance of a power MOS transistor is evaluated using the response speed of the gate voltage $V_G$ when a predetermined amount of pulse voltage $V_P$ is applied to the gate input terminal. The amount of the gate voltage $V_G$ directly applied to the gate electrode right above the channel does not immediately increase and reach the predetermined input pulse voltage $V_P$, and instead increases late after a time depending on the amounts of the gate resistance $R_G$ and the gate input capacitance $C_I$.

This delay time is called a rise time $t_{rise}$, and a relation of $t_{rise} \propto R_G C_I$ is established. The delay time $t_{rise}$ is obtained by subtracting a time taken to reach $0.1 V_P$ from a time taken to reach $0.9 V_P$ when the gate voltage $V_G$ to finally reach is $V_P$. The larger the gate resistance $R_G$ and the gate input capacitance $C_I$ are, the longer the rise time $t_{rise}$ of the gate voltage $V_G$ is, degrading the switching performance of the power MOS transistor.

Figure 3A:
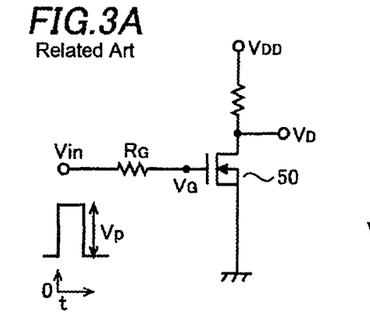
FIGS. 3A, 3B, 3C and 3D show the response characteristics of the gate voltage and the drain voltage when a pulse voltage is applied to the input terminal of the power MOS transistor.
Figure 3B:
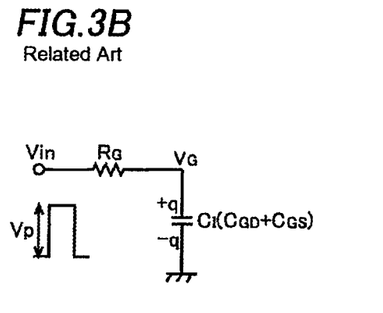
Figure 3C:
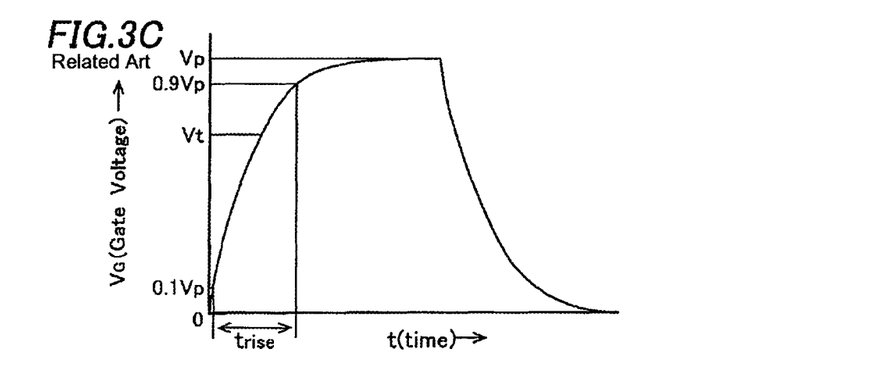

Although details will be described below, FIG. 3C shows a rise state of the gate voltage $V_G$ of a power MOS transistor 50 shown in FIG. 3A when a pulse voltage $V_P$ is applied to the input voltage thereof. The pulse voltage $V_P$ is applied to a CR circuit shown in FIG. 3B which is an equivalent circuit of the power MOS transistor 50 in FIG. 3A.

Figure 3D:
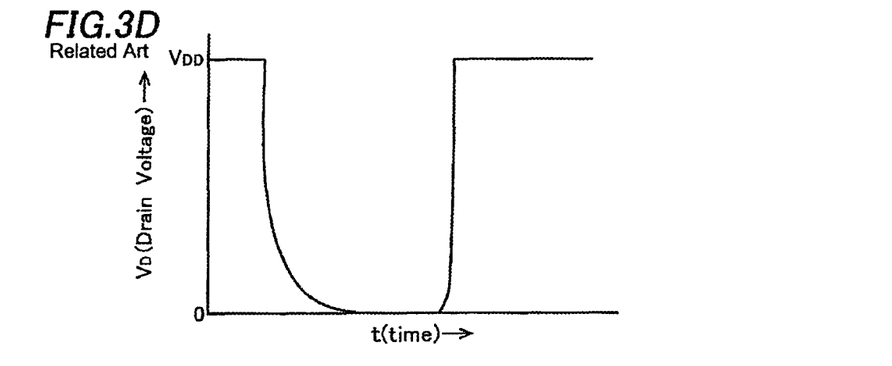

The gate voltage $V_G$ rises late after a rise time $t_{rise}$ which depends on a time constant $R_G C_I$ which is the product of the gate resistance $R_G$ and the gate input capacitance $C_I$. Furthermore, the gate voltage $V_G$ falls late when the pulse voltage $V_P$ is turned off, too. Corresponding to the gate voltage $V_G$, fall and rise delay occurs in the drain voltage $V_D$, too, as shown in FIG. 3D. Therefore, when the resistance $R_G$ of the gate wiring is large, the switching performance of the power MOS transistor is degraded.

A gate electrode was formerly made of a polysilicon film doped with impurity, but in recent years it was made by layering a metal silicide film on a polysilicon film so as to decrease the gate resistance $R_G$.

Japanese Patent Application Publication No. 2010-171433 discloses decreasing the gate input capacitance $C_I$ and gate resistance $R_G$. As to decreasing the gate input capacitance $C_I$, in a power MOS transistor, the gate-drain capacitance $C_{GD}$ which forms the gate input capacitance $C_I$ is decreased while an increase of the on-resistance is minimized.

In detail, the gate-drain capacitance $C_{GD}$ is decreased by decreasing the impurity concentration of the drift layer near the channel region so as to make the depletion layer easily extend, thereby decreasing the gate input capacitance $C_I$. On the other hand, the impurity concentration of the drift layer near the drain layer is increased, thereby decreasing the on-resistance.

As to decreasing the gate resistance $R_G$, it is disclosed that a groove is formed in the interlayer insulation film over the gate electrode extending between the drain and the source and a plug electrode is formed by filling the groove with tungsten (W) and used as a gate electrode shunt wiring. Since the metal tungsten (W) is formed to have the same thickness as that of the interlayer insulation film, the gate resistance $R_G$ is decreased.

As described in Japanese Patent Application publication No. 2010-171433, by forming the groove in the interlayer insulation film along on the gate electrode extending between the drain and the source and forming the plug electrode filling the groove with tungsten (W) as the gate electrode shunt wiring, the gate resistance $R_G$ is decreased to an enough value.

However, in order to satisfy a demand for further enhancing the switching performance, it is necessary to decrease the resistance of the plug electrode made of a tungsten (W) layer. To this end, it is necessary to further increase the thickness and width of the plug electrode made of tungsten (W). However, such a plug electrode with larger thickness and width causes a limit in miniaturizing a wiring pattern.

Therefore, a new means is necessary so as to further decrease the gate resistance $R_G$.

SUMMARY OF THE INVENTION

The invention provides a semiconductor device that includes a semiconductor chip having a source electrode of a form of fingers that extend from a source electrode terminal portion, and a drain electrode having a form of fingers that extend from a drain terminal portion. The fingers of the source electrode engage the fingers of the drain electrode. The chip also has a gate electrode running through a space between the fingers of the engaging source and drain electrodes, a first gate drawing electrode disposed at and connected to one end of the gate electrode, and a second gate drawing electrode disposed at and connected to another end of the gate electrode. The semiconductor device also includes a substrate having a gate shunting substrate wiring, and a source substrate wiring and a drain substrate wiring. The device further includes a plurality of first protrusion electrodes disposed between and connecting the gate shunting substrate wiring and the first and second gate drawing electrodes, a plurality of second protrusion electrodes disposed between and connecting the source substrate wiring and the source terminal portion of the source electrode, and a plurality of third protrusion electrodes disposed between and connecting the drain substrate wiring and the drain terminal portion of the drain electrode.

DETAILED DESCRIPTION OF THE INVENTION

The feature of a semiconductor device of an embodiment will be described hereafter referring to FIGS. 1A to 2B. The semiconductor device of the embodiment has a structure shown in FIG. 1C in which a semiconductor chip 100 including a power MOS transistor 50 shown in FIGS. 2A and 2B is connected to the front surface 201 of a BGA (Ball Grid Array) substrate 200 shown in FIG. 1A by protrusion electrodes 25.

Figure 1A:
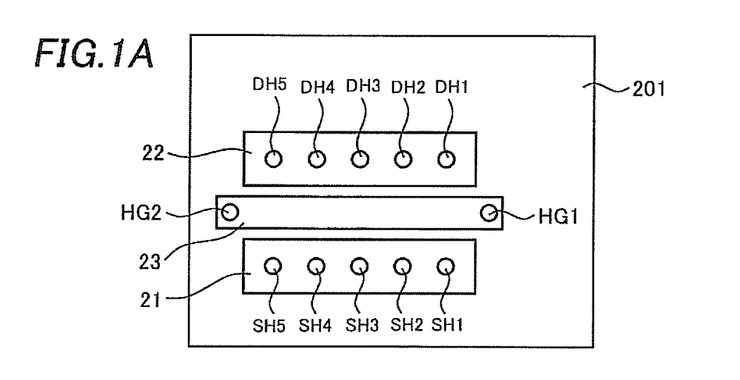
FIGS. 1A, 1B and 1C show the structures of the front and back surfaces of a BGA substrate and a cross-sectional view of a semiconductor device including a semiconductor chip and the BGA substrate in an embodiment of the invention.
Figure 2A:
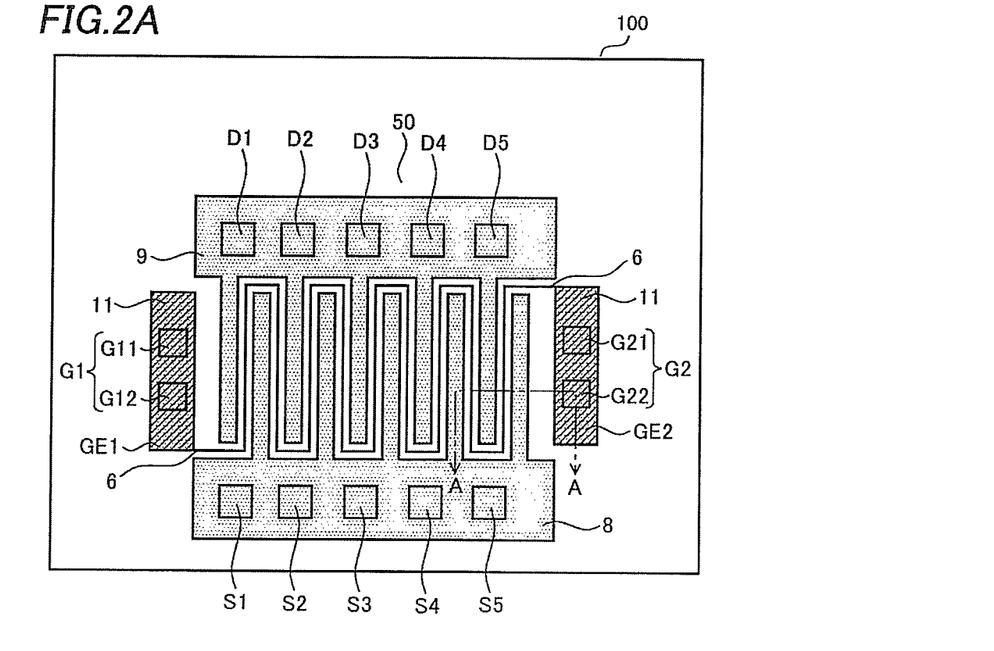
FIGS. 2A and 2B are a plan view and a main portion enlarged cross-sectional view of a power MOS transistor in the semiconductor chip of the embodiment of the invention.
Figure 2B:
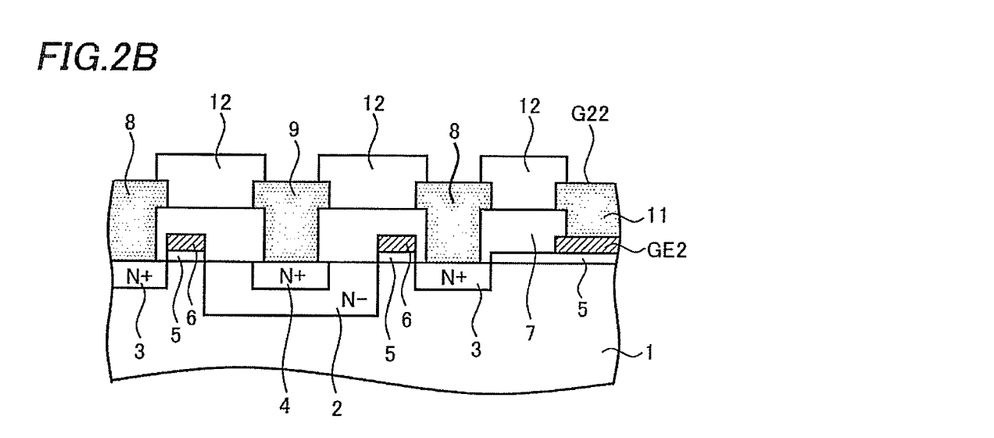

FIG. 1A is a plan view of the front surface 201 of the BGA substrate 200. Although various substrate wirings made of copper (Cu) or the like are formed, FIG. 1A shows only a source substrate wiring 21, a drain substrate wiring 22, and a gate shunting substrate wiring 23 for shunting a gate electrode which directly relate to the power MOS transistor 50 and are illustrated for explaining the semiconductor device of the embodiment. Each of the wirings is covered by a protection film (not shown), and portions of the protection film on substrate electrodes DH1 to DH5 for connecting a drain, substrate electrodes SH1 to SH5 for connecting a source, and substrate electrodes HG 1 and HG2 for connecting a gate are removed, thereby exposing portions of each of the wirings as well as other portions.

Figure 1B:
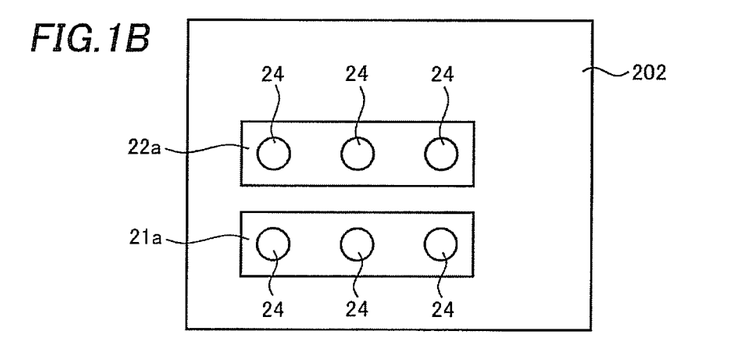

FIG. 1B is a plan view of the back surface 202 of the BGA substrate 200. Although various wirings made of copper (Cu) or the like are formed, for the same reason, FIG. 1B also shows only a back-surface source substrate wiring 21a and a back-surface drain substrate wiring 22a. The source substrate wiring 21 and the back-surface source substrate wiring 21a, and the drain substrate wiring 22 and the back-surface drain substrate wiring 22a are connected by conductive layers through through-holes (not shown) formed in the BGA substrate 200, respectively.

It is noted that only the substrate electrodes HG1 and HG2 for connecting the gate may be formed on the front surface 201 of the BGA substrate 200, and the gate shunting substrate wiring 23 may be formed on the back surface 202 of the BGA substrate 200, the gate shunting substrate wiring 23 being connected to the substrate electrodes HG1 and HG2 for connecting the gate through through-holes formed in the BGA substrate 200. Solder bumps 24 are formed in predetermined regions of each of the back-surface wirings.

FIG. 2A is a plan view of the semiconductor chip 100 used in the semiconductor device of the embodiment. FIG. 2A shows only the power MOS transistor 50 and peripheral circuits such as a control circuit or the like which are not necessary for explaining the invention are omitted. FIG. 2B is an enlarged cross-sectional view of a main portion thereof along line A-A.

As shown in FIG. 2A, the power MOS transistor 50 employs finger form electrodes in which a source electrode 8 and a drain electrode 9 respectively have finger portions and the finger portions are disposed between these electrodes. Five source connection electrodes 51 to S5 which will be described below are shown in the drawing portion of the source electrode 8, and five drain connection electrodes D1 to D5 are shown in the drawing portion of the drain electrode 9, as an example. The number of the connection electrodes may be increased or decreased depending on the size of each of the electrodes.

From a view point of decreasing the on-resistance, it is more advantageous that the shape of the power MOS transistor 50 is transversely long than longitudinally long as a whole by shortening the lengths of the finger form source electrode 8 and drain electrode 9 as shown in FIG. 2A. The short length of the drain electrode 9 further decreases the resistance of the drain electrode 9, contributing to the lower on-resistance of the power MOS transistor 50.

A gate electrode 6 extends between the finger form source electrode 8 and drain electrode 9 from one end portion GE1 to another end portion GE2 of the finger form electrodes as shown in FIG. 2A. As described above, when the shape of the power MOS transistor 50 is transversely long, the length of the gate electrode 6 between the end portion GE1 and the end portion GE2 is longer than a case of a longitudinally long power MOS transistor 50, by the number of corner portions in the finger portions.

FIG. 2B is an enlarged cross-sectional view of a main portion of FIG. 2A along line A-A. An N type epitaxial layer (not shown) is formed on a P type semiconductor substrate (not shown), and the N type epitaxial layer is divided in a plurality of active regions by P+ type isolation layers (not shown). A P type well layer 1 is formed in the N type epitaxial layer in one of the active regions. A P type body layer (not shown) is formed in the P type well layer 1. An N+ type source layer 3 is formed in the P type body layer.

Furthermore, an N− type drift layer 2 is formed in the P type well layer 1, and an N+ type drain layer 4 is formed in the N− type drift layer 2. A gate insulation film 5 is formed on the P type well layer 1 and so on between the N+ type source layer 3 and the N− type drain layer 2, and the gate electrode 6 made of a silicide film or the like is formed thereon. The gate insulation film 5 and the gate electrode 6 extend from the end portion GE1 to the end portion GE2 of the gate electrode 6 on the left and right sides of the finger form electrodes shown in FIG. 2A.

The source electrode 8 made of aluminum (Al) or the like connected to the N+ type source layer 3, the drain electrode 9 connected to the N+ type drain layer 4, and the gate drawing electrodes 11 connected to the end portion GE1 and the end portion GE2 of the gate electrode 6 through contact holes formed in an interlayer insulation film 7 are formed. According to need, a gate drawing electrode 11 (not shown) connected to a portion of the gate electrode 6 or the whole of the gate electrode 6 in the finger portions is also formed.

A passivation film 12 is formed on the whole surface of the semiconductor chip including the gate drawing electrodes 11 and so on, and the source connection electrodes S1 to S5 which are portions of the source electrode 8, the drain connection electrodes D1 to D5 which are portions of the drain electrode 9, and gate connection electrodes G11, G12, G21 and G22 which are portions of the gate drawing electrodes 11 are exposed from openings formed in the passivation film 12 as shown in FIG. 2A.

According to need, a gate connection electrode GXX (not shown) of the gate drawing electrode 11 connected to a portion of the gate electrode 6 or the whole of the gate electrode 6 in the finger portions is also exposed. Hereafter, a description will be given by referring to G11 and G12 as G1 and referring to G21 and G22 as G2.

In a case of a multilayer wiring structure, an interlayer insulation film for the layers is formed, and upper wirings made of aluminum (Al) or the like which are connected to lower wirings through through-holes formed in the interlayer insulation film are formed. The source connection electrodes S1 to S5, the drain connection electrodes D1 to D5, and the gate connection electrodes G1 and G2 are drawn to the upper wirings through the through-holes according to need and exposed in the openings of the passivation film 12.

Figure 1C:
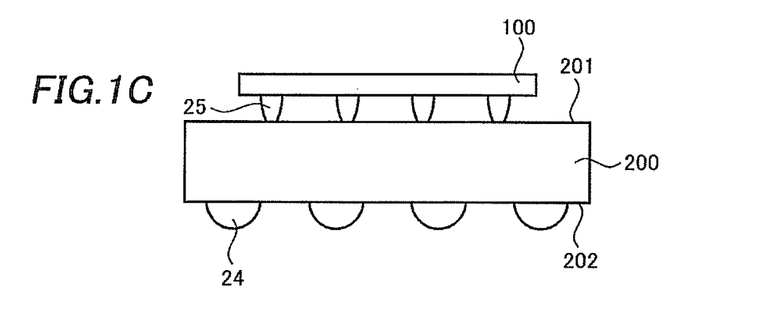

The front surface 201 of the BGA substrate 200 shown in FIG. 1A and the semiconductor chip 100 shown in FIGS. 2A and 2B are connected by the protrusion electrodes 25 as shown in FIG. 1C, thereby providing the semiconductor device of the embodiment combining the BGA substrate 200 and the semiconductor chip 100. The combining of the BGA substrate 200 and the semiconductor chip 100 is performed by the following process.

Gold (Au) wires are wire-bonded to the source connection electrodes S1 to S5, the drain connection electrodes D1 to D5 and the gate connection electrodes G1 and G2 which are exposed in the openings formed in the passivation film 12 covering the front surface of the semiconductor chip 100, and also wire-bonded to other necessary wirings in the openings. The gold (Au) wires are then cut right above the wire-bonded portions. By this, the protrusion electrodes 25 made of gold (Au) are formed on the wirings and so on in the openings.

After the end portions of the protrusion electrodes 25 are planarized, the protrusion electrodes 25 on the source connection electrodes S1 to S5 are connected to the substrate electrodes SH1 to SH5 for connecting the source wiring on the front surface 201 of the BGA substrate 200, the protrusion electrodes 25 on the drain connection electrodes D1 to D5 are connected to the substrate electrodes DH1 to DH5 for connecting the drain wiring, and the protrusion electrodes 25 on the gate connection electrodes G1 and G2 are connected to the substrate electrodes HG1 and HG2 for connecting the gate wiring by alignment, thereby combining the BGA substrate 200 and the semiconductor chip 100.

In the embodiment, as described above, the semiconductor chip 100 is connected to the BGA substrate 200 by the protrusion electrodes 25 formed by wire-bonding the gold (Au) wires. However, a WLP (Wafer Level Chip Size Package) may be employed instead, in which solder bump electrodes and so on are formed on the source connection electrodes S1 to S5 and so on of the semiconductor chip 100 by a predetermined process, and this WLP may be connected to the substrate electrodes for connecting the wirings on the front surface 201 of the BGA substrate 200 by the solder bump electrodes.

Alternatively, instead of WLP, the semiconductor chip 100 may be formed with ordinary solder bumps. Furthermore, the protrusion electrodes 25 may be formed by electrolytic plating or electroless plating with gold (Au).

In this embodiment, the gate shunting substrate wiring 23 which shunts the gate connection electrode G1 and the gate connection electrode G2 in both the end portions GE1 and GE2 of the gate electrode 6 of the power MOS transistor is formed by using a wiring made of copper (Cu) or the like with large thickness and low resistance formed on the front surface 201 of the BGA substrate 200. FIG. 5C shows an enhancement of the switching performance by the gate shunting substrate wiring 23 of the embodiment. The enhancement of the switching performance obtained by the embodiment will be described hereafter, compared with switching performance in a case of a power MOS transistor which does not have the gate shunting substrate wiring 23 shown in FIGS. 4A, 4B and 4C.

Before comparing these, a description will be given about the response characteristics of the gate voltage $V_G$ and the drain voltage $V_D$ of the power MOS transistor 50 having a gate resistance $R_G$ and a gate input capacitance $C_I$ when a pulse voltage $V_P$ is applied thereto, referring to FIGS. 3A, 3B and 3C. FIG. 3A is a circuit diagram of the power MOS transistor 50, and FIG. 3B is a circuit diagram of an equivalent circuit thereof having an $R_G C_I$ time constant. The gate input capacitance $C_I$ of the power MOS transistor 50 has a value obtained by adding a capacitance $C_{GS}$ between the gate and the source and a feedback capacitance $C_{GD}$ between the gate and the drain.

The gate voltage $V_G$ when a pulse voltage $V_P$ is applied to the input terminal $V_{in}$, i.e., a voltage applied to the gate input capacitance $C_I$ is $q/C_I = V_P - R_G(dq/dt) = V_G$ where the accumulation charge amount of $C_I$ is q, and $q = C V_P(1-e^{-t/R_G C_I})$ is obtained by solving this differential equation. Thus, $V_G = q/C_I = V_P(1-e^{-t/R_G C_I})$. The gate voltage $V_G$ when the pulse voltage $V_P$ is turned off is $V_G = V_P e^{-t/R_G C_I}$, which is obtained by solving $R dq/dt + q/C_I = 0$ with an initial value $t=0$ and $q = C_I V_P$. It is shown that the gate voltage $V_G$ changes exponentially and not stepwise corresponding to the pulse voltage $V_P$.

FIG. 3C shows a rise and fall state of the gate voltage $V_G$ when a pulse voltage $V_P$ is applied. The gate voltage $V_G$ does not rise immediately when the pulse voltage $V_P$ is turned on, and the gate voltage $V_G$ does not become zero immediately when the pulse voltage $V_P$ is turned off. As shown in FIG. 3D, even when the gate voltage $V_G$ increases, the drain voltage $V_D$ does not decrease until the gate voltage $V_G$ exceeds a threshold voltage $V_t$. Furthermore, even when the gate voltage $V_G$ decreases, the drain voltage does not increase until the gate voltage $V_G$ becomes lower than the threshold voltage $V_t$.

The rise time $t_{rise}$ of the gate voltage $V_G$ increases in proportion to the product of $R_G C_I$. Therefore, in order to enhance the switching performance, it is necessary to minimize the gate resistance $R_G$ as well as decrease the gate input capacitance $C_I$.

In FIGS. 4A to 5C, the switching performance of the power MOS transistor 50 having the large gate width and the long gate electrode 6 is analyzed supposing that the power MOS transistor 50 includes multiple small power MOS transistors connected in parallel. The small power MOS transistor may be disposed for each finger or for a plurality of fingers.

Figure 4A:
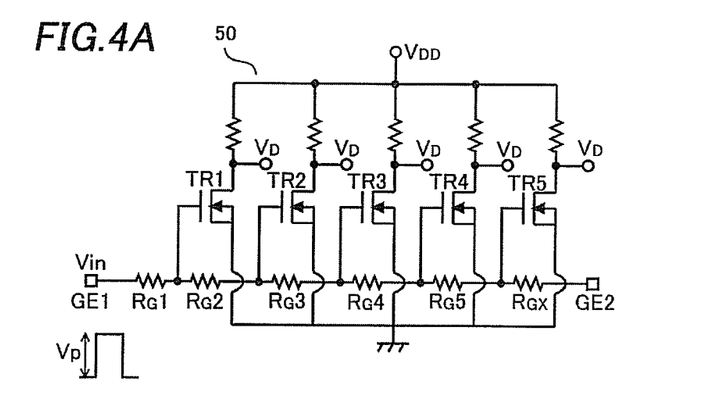
FIGS. 4A, 4B and 4C show a structure in which the power MOS transistor of the semiconductor device of the embodiment includes a plurality of power MOS transistors disposed in parallel, and the response characteristic of the gate voltage of each of the power MOS transistors in a semiconductor chip when a pulse voltage is inputted thereto.
Figure 4B:
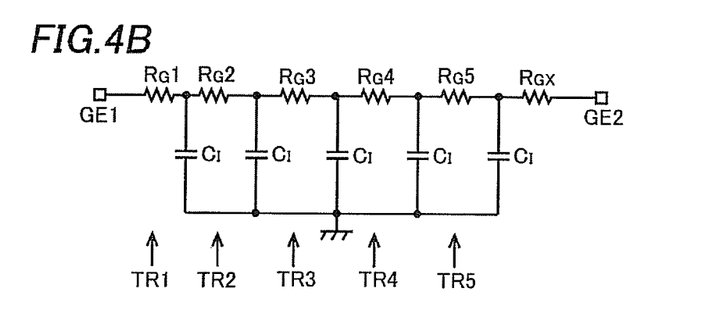

FIG. 4A shows a circuit diagram of a semiconductor chip which is not connected to the BGA substrate 200, in which the single power MOS transistor 50 includes combined five small power MOS transistors TR1 to TR5, as an example. A voltage $V_P$ is applied to the gate electrode end portion GE1 as an input voltage $V_{in}$. FIG. 4B shows an equivalent circuit thereof $R_G1$ to $R_G5$ are the gate resistances of the power MOS transistors TR1 to TR5, and $R_GX$ is the resistance between TR5 and the gate electrode end portion GE2.

The gate resistance of the first transistor TR1 which is closest to the gate electrode end portion GE1 is $R_G1$, the gate resistance of the third transistor TR3 is $R_G1+R_G2+R_G3$, and the gate resistance of the fifth transistor TR5 is $R_G1+R_G2+R_G3+R_G4+R_G5$. The gate resistances $R_G$ of the small transistors thus increase gradually from the end portion GE1 of the gate electrode 6 which is the signal input terminal to the opposite end portion GE2 of the gate electrode 6.

Figure 4C:
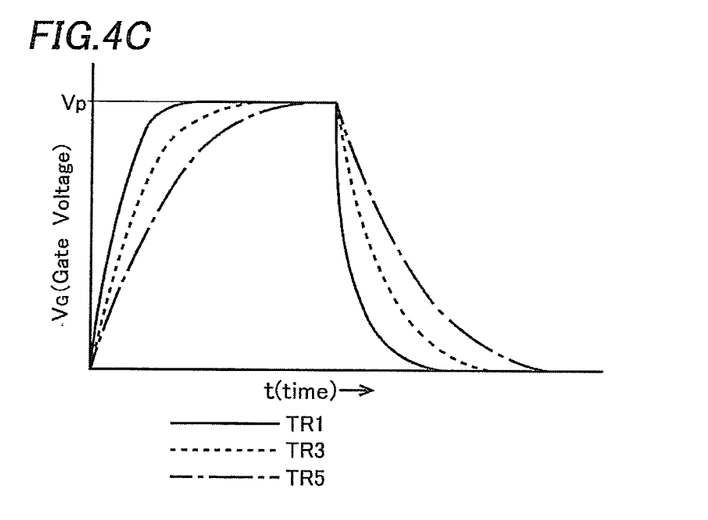

As a result, as shown in FIG. 4C, the rise time of the gate voltage $V_G$ of the small transistor TR1 having a small gate resistance value which is closest to the signal input terminal is fastest, and the rise time of the transistor TR5 having a large gate resistance value which is farthest from the input terminal and closest to the opposite terminal GE2 is longest. The rise times of the transistors TR2, TR3 and TR4 increase in order between the transistor TR1 and the transistor TR5. The rise time of the gate voltage $V_G$ of the power MOS transistor 50 is determined by the combination of these transistors.

Figure 5A:
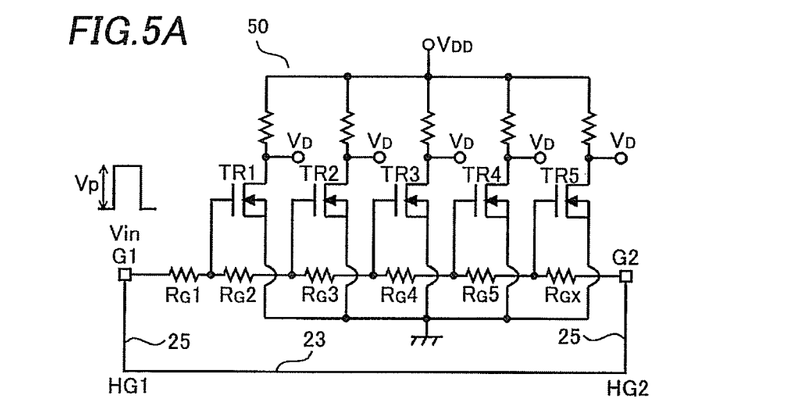
FIGS. 5A, 5B and 5C show a structure in which the power MOS transistor of the semiconductor device of the embodiment includes a plurality of power MOS transistors disposed in parallel, and the response characteristic of the gate voltage of each of the power MOS transistors in a semiconductor device when a pulse voltage is inputted thereto.

FIG. 5A is a circuit diagram of the power MOS transistor 50 shown in FIG. 4A when this is connected to the front surface 201 of the BGA substrate 200. The portion connected to the front surface 201 of the BGA substrate 200 is shown only in a necessary portion for understanding the invention. In detail, FIG. 5A shows only the gate shunting substrate wiring 23 and the substrate electrodes HG1 and HG2 for connecting the gate on the front surface 201 of the BGA substrate 200, the gate connection electrodes G1 and G2 connected to the substrate electrodes HG1 and HG2 for connecting the gate, and the protrusion electrodes 25.

Figure 5B:
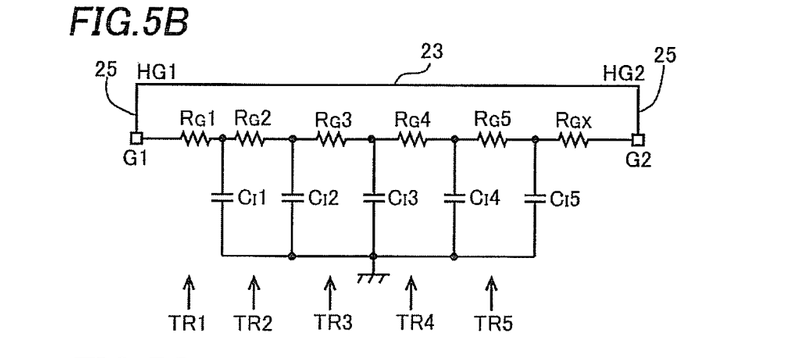
Figure 5C:
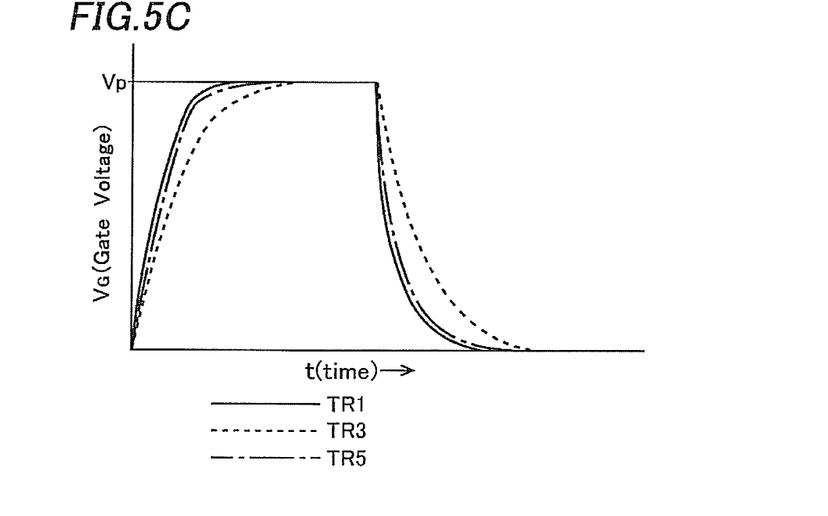

FIG. 5B is an equivalent circuit of this. FIG. 5B differs from FIG. 4B in that the gate connection electrode G1 connected to the gate electrode end portion GE1 which is the signal input terminal and the gate connection electrode G2 connected to the gate electrode end portion GE2 are connected to the substrate electrodes HG1 and HG2 for connecting the gate on either end of the gate shunting substrate wiring 23 formed on the front surface 201 of the BGA substrate 200.

The gate shunting substrate wiring 23 is made of a thin film of copper (Cu) or the like. This is thicker by about one digit than the metal wirings made of aluminum (Al) or the like used for the semiconductor chip 100 which is thinner than 1 μm, and also has smaller resistivity than the metal wirings of aluminum (Al) or the like. In detail, the sheet resistance of the substrate wiring 23 for shunting the gate electrode becomes smaller than the metal wirings made of aluminum (Al) or the like of the semiconductor chip 100 by about one digit or more.

Therefore, the potential of the gate connection electrode G2 which is far from the signal input terminal is almost equal to the potential of the gate connection electrode G1. As a result, the gate resistance of TR1 is the parallel resistance of $R_G1$ and $R_G2+R_G3+R_G4+R_G5+R_GX$, the gate resistance of TR2 is the parallel resistance of $R_G1+R_G2$ and $R_G3+R_G4+R_G5+R_GX$, the gate resistance of TR3 is the parallel resistance of $R_G1+R_G2+R_G3$ and $R_G4+R_G5+R_GX$. The gate resistance of TR4 is equal to that of TR2, and the gate resistance of TR5 is equal to that of TR1.

When it is supposed that $R_G1$, $R_G2$, $R_G3$, $R_G4$, $R_G5$ and $R_GX$ are equal and referred to as R, the gate resistances of TR1 and TR5 are (5/6) R, the gate resistances of TR2 and TR4 are (4/3) R, the gate resistance of TR3 is (3/2) R. On the other hand, in the case of FIGS. 4A and 4B, the gate resistance of TR1 is R, the gate resistance of TR2 is 2R, the gate resistance of TR3 is 3R, the gate resistance of TR4 is 4R, and the gate resistance of TR5 is 5R and large. Thus, the gate resistance is largely decreased in the embodiment.

The rise and fall characteristics of the gate voltage $V_G$ when a pulse voltage $V_P$ is inputted in this case are shown in FIG. 5C. Since the gate resistance values of TR1 and TR5 are almost equal, the rise and fall of the gate voltage $V_G$ are equal between TR1 and TR5. Compared with TR1 in FIG. 4, the rise time and fall time of the gate voltage $V_G$ of TR1 are decreased by the amount of decrease of the gate resistance to (5/6) R. In the case of TR5, the gate resistance decreases from 5R in FIG. 4 to (5/6) R, and thus the rise time and fall time of the gate voltage $V_G$ are largely improved.

By the amount of decrease of the gate resistance from 2R in FIG. 4 to (4/3) R in TR2, from 3R to (3/2) R in TR3 and from 4R to (4/3) R in TR4, the rise time and fall time of the gate voltage $V_G$ are largely improved.

As a result, the rise and fall characteristics of the gate voltage $V_G$ of the power MOS transistor 50 of the embodiment when a pulse voltage $V_P$ is inputted thereto are largely improved compared with the rise and fall characteristics of the gate voltage $V_G$ of the single power MOS transistor 50 shown in FIG. 4. As described above, the feature of the embodiment is that the rise and fall characteristics of the gate voltage $V_G$ are largely improved by shunting the gate connection electrodes G1 and G2 by the low resistance gate shunting substrate wiring 23 formed on the front surface 201 of the BGA substrate 200.

Figure 6A:
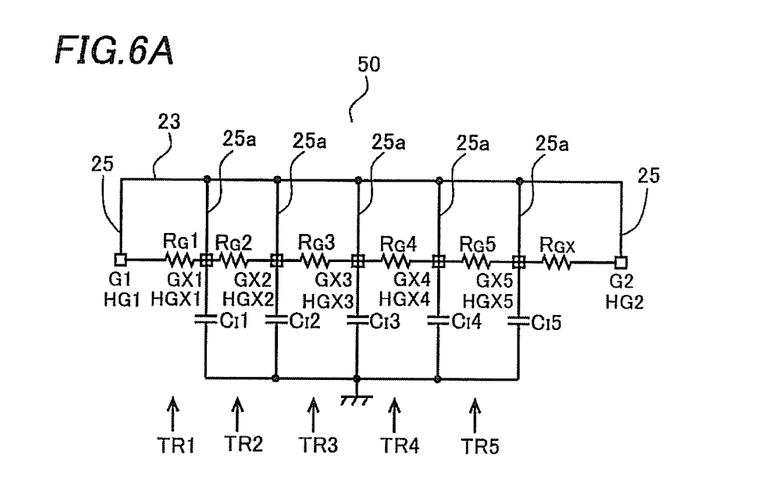
FIGS. 6A, 6B and 6C show a structure in which a power MOS transistor of a semiconductor device of another embodiment includes a plurality of power MOS transistors disposed in parallel, and the response characteristic of the gate voltage of each of the power MOS transistors in a semiconductor device when a pulse voltage is inputted thereto, and a plan view of the power MOS transistor of the semiconductor device.

Furthermore, as shown by an equivalent circuit in FIG. 6A, the switching performance is further enhanced by also forming protrusion electrodes 25a in gate connection electrodes GX1 to GX5 which are portions of the gate drawing electrode 11 connected to the gate electrode 6 in the finger portions and connecting the protrusion electrodes 25a to substrate electrodes HGX1 to HGX5 for connecting the gate which are portions of the gate shunting substrate wiring 23 formed on the front surface 201 of the BGA substrate 200. FIG. 6C shows a plan view of the power MOS transistor 50 that corresponds to the equivalent circuit shown in FIG. 6A. The enhancement is almost the same even in the state where G1 and HG1 are not connected and G2 and HG2 are not connected.

In this case, a pulse voltage $V_P$ is applied to the transistors TR1 to TR5 not through the metal wirings made of aluminum (Al) or the like which are ordinarily used in the semiconductor chip 100 and has a sheet resistance of about 40 mΩ, but through the gate shunting substrate wiring 23 which has a lower sheet resistance than the former by about one digit.

Figure 6B:
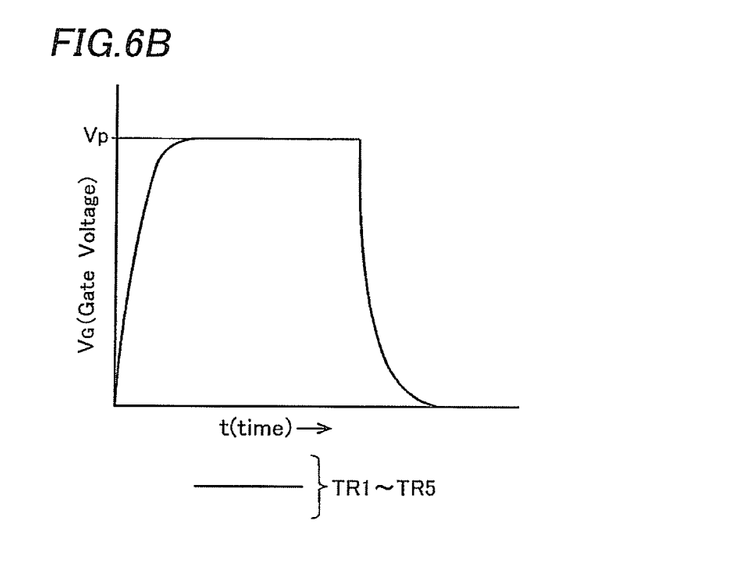
Figure 6C:
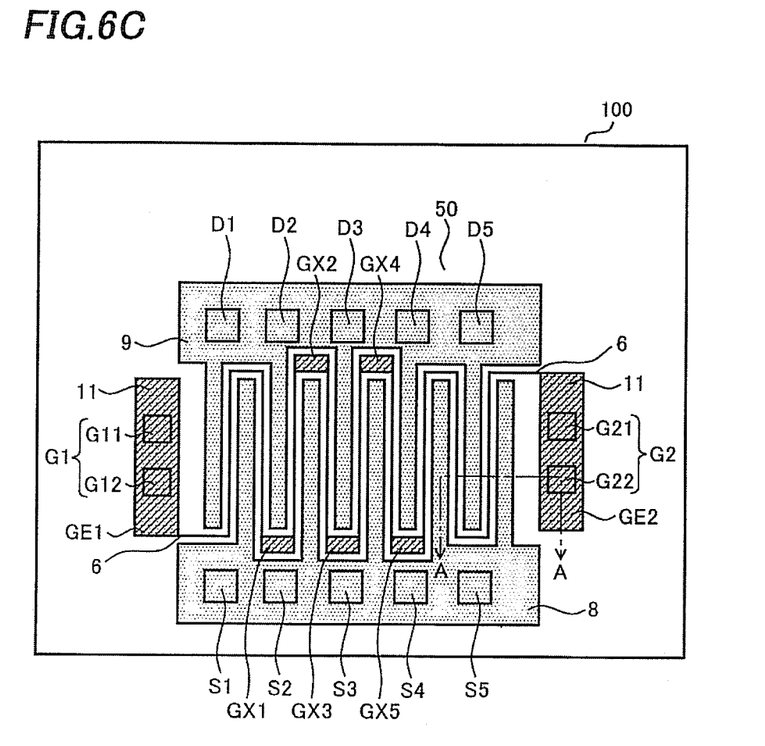

Therefore, as shown in FIG. 6B, each of the transistors shows the similarly enhanced rise and fall characteristics of the gate voltage $V_G$, and the rise and fall characteristics of the gate voltage $V_G$ of the power MOS transistor 50 as a whole are also largely enhanced. Furthermore, in this case, the switching performance is also enhanced even when only one of the gate connection electrodes GX1 to GX5, instead of all of the gate connection electrodes GX1 to GX5, is connected to corresponding one of the substrate electrodes HGX1 to HGX5 for connecting the gate. In this case, it is preferable to connect GX3 and HGX3.

Furthermore, the MOS transistors forming the power MOS transistor of the embodiment operate equally, thereby providing an advantage in an ESD (Electro Static Discharge) characteristic.

Figure 7A:
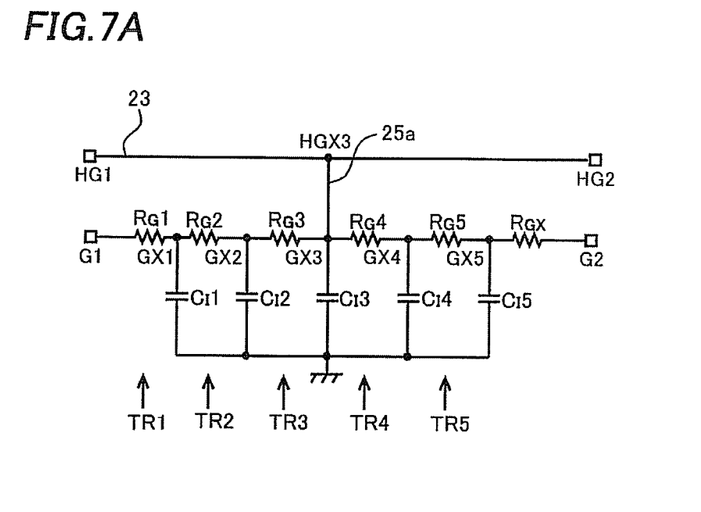
FIGS. 7A and 7B show a structure of the semiconductor device of another two embodiments.

As shown by an equivalent circuit in FIG. 7A, even when only the gate connection electrode GX3 of TR3 is connected to the substrate electrode HGX3 for connecting the gate and there does not exist other gate connection electrode, the switching performance is also enhanced. In this case, the gate resistance of TR3 is small since it is made of the gate shunting substrate wiring 23. The gate resistances of TR2 and TR4 are $R_G3$ and $R_G4$, respectively, and the gate resistances of TR1 and TR5 are $R_G2+R_G3$ and $R_G4+R_G5$, respectively. When $R_G1, R_G^2, R_G^3, R_G4, R_G5$ and $R_GX$ are supposed to be equal and referred to as R, as described above, the gate resistances of TR2 and TR4 are R, and the gate resistances of TR1 and TR5 are 2R.

Therefore, the enhancement of the switching performance is not larger than in the structure of FIGS. 6A and 6B, but it may be equal to the enhancement in FIG. 5 or more than this. This is because the gate resistances of TR2 and TR4 are R and are smaller than (4/3) R of the case of FIG. 5, and the gate resistance of TR3 is lower than (3/2) R of the case of FIG. 5 by about one digit, although the gate resistances of TR1 and TR5 are 2R and are larger than (5/6) R of the case of FIG. 5. In this case, by further connecting either one of the gate connection electrodes G1 and G2 to either corresponding one of the substrate electrodes HG1 and HG2 for connecting the gate, the switching performance is enhanced more.

Figure 7B:
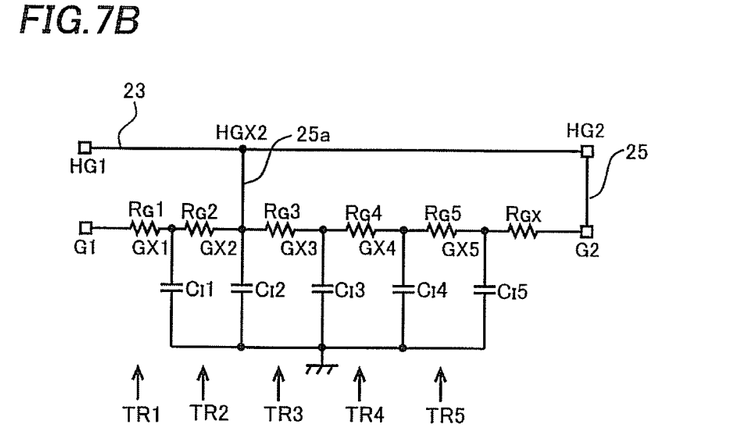

Furthermore, the enhancement of the switching performance is also achieved even when the gate connection electrode GX2 is connected to the substrate electrode HGX2 for connecting the gate, the gate connection electrode G2 farther from the gate connection electrode GX2 is connected to the substrate electrode HG2 for connecting the gate, and the gate connection electrode G1 closer to the gate connection electrode GX2 is not connected to the substrate electrode HG1 for connecting the gate, as shown by an equivalent circuit in FIG. 7B, for example.

Although the embodiment is described about a semiconductor device in which the semiconductor chip 100 is connected to a BGA substrate, the invention is also applicable to an ordinary substrate without a bump electrode.

The semiconductor device of the invention achieves decrease in the gate resistance and further enhancement in the switching performance of a power MOS transistor.

What is claimed is:

1. A semiconductor device comprising:
a semiconductor chip comprising a source electrode of a form of fingers that extend from a source electrode terminal portion, a drain electrode having a form of fingers that extend from a drain terminal portion, the fingers of the source electrode engaging the fingers of the drain electrode, a gate electrode running through a space between the fingers of the engaging source and drain electrodes, a first gate drawing electrode disposed at and connected to one end of the gate electrode, and a second gate drawing electrode disposed at and connected to another end of the gate electrode;
a substrate comprising a gate shunting substrate wiring, a source substrate wiring and a drain substrate wiring;
a plurality of first protrusion electrodes disposed between and connecting the gate shunting substrate wiring and the first and second gate drawing electrodes;
a plurality of second protrusion electrodes disposed between and connecting the source substrate wiring and the source terminal portion of the source electrode; and
a plurality of third protrusion electrodes disposed between and connecting the drain substrate wiring and the drain terminal portion of the drain electrode.

2. A semiconductor device comprising:
a semiconductor chip comprising a source electrode of a form of fingers that extend from a source electrode terminal portion, a drain electrode having a form of fingers that extend from a drain terminal portion, the fingers of the source electrode engaging the fingers of the drain electrode, a gate electrode running through a space between the fingers of the engaging source and drain electrodes, a first gate drawing electrode disposed at and connected to one end of the gate electrode, a second gate drawing electrode disposed at and connected to another end of the gate electrode, and a plurality of third gate drawing electrodes disposed at and connected to the gate electrode in the space;
a substrate comprising a gate shunting substrate wiring, a source substrate wiring and a drain substrate wiring;
a plurality of first protrusion electrodes disposed between and connecting the gate shunting substrate wiring and the first, second and third gate drawing electrodes;
a plurality of second protrusion electrodes disposed between and connecting the source substrate wiring and the source terminal portion of the source electrode; and
a plurality of third protrusion electrodes disposed between and connecting the drain substrate wiring and the drain terminal portion of the drain electrode.

3. A semiconductor device comprising:
a semiconductor chip comprising a source electrode of a form of fingers that extend from a source electrode terminal portion, a drain electrode having a form of fingers that extend from a drain terminal portion, the fingers of the source electrode engaging the fingers of the drain electrode, a gate electrode running through a space between the fingers of the engaging source and drain electrodes, a gate drawing electrode disposed at and connected to the gate electrode in the space;
a substrate comprising a gate shunting substrate wiring, a source substrate wiring and a drain substrate wiring;
a plurality of first protrusion electrodes disposed between and connecting the gate shunting substrate wiring and the gate drawing electrode;
a plurality of second protrusion electrodes disposed between and connecting the source substrate wiring and the source terminal portion of the source electrode; and
a plurality of third protrusion electrodes disposed between and connecting the drain substrate wiring and the drain terminal portion of the drain electrode.

4. A semiconductor device comprising:
a semiconductor chip comprising a source electrode of a form of fingers that extend from a source electrode terminal portion, a drain electrode having a form of fingers that extend from a drain terminal portion, the fingers of the source electrode engaging the fingers of the drain electrode, a gate electrode running through a space between the fingers of the engaging source and drain electrodes, a first gate drawing electrode disposed at and connected to one end of the gate electrode and a second gate drawing electrode disposed at and connected to the gate electrode in the space;

a substrate comprising a gate shunting substrate wiring, a source substrate wiring and a drain substrate wiring;
a plurality of first protrusion electrodes disposed between and connecting the gate shunting substrate wiring and the first and second gate drawing electrodes;
a plurality of second protrusion electrodes disposed between and connecting the source substrate wiring and the source terminal portion of the source electrode; and
a plurality of third protrusion electrodes disposed between and connecting the drain substrate wiring and the drain terminal portion of the drain electrode.

5. The semiconductor device of claim 1, wherein the first, second and third protrusion electrodes comprise a gold bump electrode formed on connecting portions of corresponding electrodes.

6. The semiconductor device of claim 5, wherein the gold bump electrode comprises a gold wire wire-bonded to the connecting portions, and the gold wire is cut at its end.

7. The semiconductor device of claim 1, wherein the first, second and third protrusion electrodes comprise a solder bump electrode formed on connecting portions of corresponding electrodes.

8. The semiconductor device of claim 5, wherein the semiconductor chip comprises a wafer level chip size package.

9. The semiconductor device of claim 1, wherein the substrate comprises a BGA substrate comprising a back-surface source substrate wiring and a back-surface drain substrate wiring with solder bumps on its back surface, the back-surface source substrate wiring and the back-surface drain substrate wiring being connected to the source substrate wiring and the drain substrate wiring, respectively, on its front surface through through-holes formed in the substrate.

10. The semiconductor device of claim 9, wherein the gate shunting substrate wiring is formed on the back surface of the BGA substrate, the semiconductor device further comprising a gate connecting substrate electrode formed on the front surface of the BGA substrate, the gate connecting substrate electrode being connected to the gate shunting substrate wiring through a through-hole formed in the BGA substrate.

11. The semiconductor device of claim 1, wherein the semiconductor chip comprises a semiconductor integrated circuit comprising a power MOS transistor comprising the source electrode and the drain electrode, a control circuit for the power MOS transistor, and a peripheral circuit.

12. The semiconductor device of claim 1 further comprising at least one third gate drawing electrode disposed at and connected to the gate electrode in the space and coupled to the gate shunting substrate wiring.

13. The semiconductor device of claim 12, wherein the at least one third gate drawing electrode is disposed proximate to a tip of one of the form of fingers that extend either from the drain electrode or the source electrode, and wherein the fingers of the source electrode are separated from the fingers of the drain electrode by an interlayer dielectric.

14. The semiconductor device of claim 12, wherein the at least one third gate drawing electrode is substantially centrally disposed between the first gate drawing electrode and the second gate drawing electrode.

15. The semiconductor device of claim 2, wherein at the least one third gate drawing electrode is proximate to one of the source electrode terminal portion or the drain terminal portion.

16. The semiconductor device of claim 3 further comprising:
a second gate drawing electrode disposed at and connected to one end of the gate electrode; and
a third gate drawing electrode disposed at and connected to another end of the gate electrode.

17. The semiconductor device of claim 3, wherein the gate drawing electrode is disposed proximate to a tip of one finger.

18. The semiconductor device of claim 3, wherein the substrate comprises a BGA substrate comprising a back-surface source substrate wiring and a back-surface drain substrate wiring with solder bumps on its back surface, the back-surface source substrate wiring and the back-surface drain substrate wiring being connected to the source substrate wiring and the drain substrate wiring, respectively, on its front surface through through-holes formed in the substrate.

19. The semiconductor of claim 4, wherein the second gate drawing electrode is disposed proximate to a tip of one finger.

20. The semiconductor device of claim 4, wherein the substrate comprises a BGA substrate comprising a back-surface source substrate wiring and a back-surface drain substrate wiring with solder bumps on its back surface, the back-surface source substrate wiring and the back-surface drain substrate wiring being connected to the source substrate wiring and the drain substrate wiring, respectively, on its front surface through through-holes formed in the substrate.

* * * * *